US010248268B2

(12) United States Patent
Li et al.

(10) Patent No.: US 10,248,268 B2
(45) Date of Patent: Apr. 2, 2019

(54) OGS CAPACITIVE TOUCH SCREEN AND MANUFACTURING METHOD THEREOF

(71) Applicants: Boe Technology Group Co., Ltd., Beijing (CN); Hefei Xinsheng Optoelectronics Technology Co., Ltd., Hefei (CN)

(72) Inventors: Jun Li, Beijing (CN); Ming Hu, Beijing (CN); Lei Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 340 days.

(21) Appl. No.: 15/105,671

(22) PCT Filed: Jan. 6, 2016

(86) PCT No.: PCT/CN2016/070233
§ 371 (c)(1),
(2) Date: Jun. 17, 2016

(87) PCT Pub. No.: WO2017/016192
PCT Pub. Date: Feb. 2, 2017

(65) Prior Publication Data
US 2018/0203538 A1 Jul. 19, 2018

(30) Foreign Application Priority Data

Jul. 30, 2015 (CN) .......................... 2015 1 0457155

(51) Int. Cl.
*G06F 3/044* (2006.01)
(52) U.S. Cl.
CPC .................................. *G06F 3/044* (2013.01)

(58) Field of Classification Search
CPC ........... G06F 2203/04105; G06F 3/044; G06F 3/0416; G06F 3/0414
See application file for complete search history.

(56) References Cited

U.S. PATENT DOCUMENTS

2013/0044074 A1* 2/2013 Park .................... G02F 1/13338
345/174
2015/0097810 A1* 4/2015 Aoki ....................... G06F 3/044
345/174

FOREIGN PATENT DOCUMENTS

CN 104317470 1/2015
CN 204203935 U 3/2015
(Continued)

OTHER PUBLICATIONS

First Office Action for Chinese Patent Application No. 201510457155.2 dated Aug. 1, 2017.
(Continued)

Primary Examiner — Abbas I Abdulselam
(74) Attorney, Agent, or Firm — Calfee, Halter & Griswold LLP

(57) ABSTRACT

The present disclosure discloses an OGS capacitive touch screen and a manufacturing thereof. The OGS capacitive touch screen includes: a glass substrate; a first transparent electrically-conductive layer formed on the glass substrate and including a plurality of first touch electrodes arranged in a first direction; an overcoat layer formed on the first transparent electrically-conductive layer; a plurality of vias formed in the overcoat layer, the vias corresponding to lead wire positions reserved for the plurality of first touch electrodes; and a second transparent electrically-conductive layer formed on the overcoat layer and including a plurality of second touch electrodes arranged in a second direction.

19 Claims, 2 Drawing Sheets

(56) References Cited

FOREIGN PATENT DOCUMENTS

| | | |
|---|---|---|
| CN | 104536630 | 4/2015 |
| CN | 104793822 | 7/2015 |
| CN | 204515750 | 7/2015 |
| CN | 204515750 U | 7/2015 |
| CN | 105094482 | 11/2015 |
| CN | 104793822 A | 7/2017 |
| JP | 2013167953 | 8/2013 |
| JP | 2013167953 A | 8/2013 |

OTHER PUBLICATIONS

Second Office Action for Chinese Patent Application No. 201510457155.2 dated Nov. 15, 2017.
International Search Report and Written Opinion from PCT/CN2016/070233 dated Mar. 31, 2016.

* cited by examiner

OGS CAPACITIVE TOUCH SCREEN AND MANUFACTURING METHOD THEREOF

CROSS-REFERENCE TO THE RELATED APPLICATIONS

The present application is the U.S. national phase entry of PCT/CN2016/070233, with an international filing date of Jan. 6, 2016, which claims the benefit of Chinese Patent Application No. 201510457155.2, filed on Jul. 30, 2015, the entire disclosures of which are incorporated herein by reference.

TECHNICAL FIELD

The present disclosure relates to the field of display technologies, and specifically to an One Glass Solution ("OGS") capacitive touch screen and a manufacturing method thereof.

BACKGROUND

OGS touch screens are based on a technique of directly forming on a glass substrate an Indium Tin Oxide ("ITO") layer and sensors, wherein the glass substrate plays dual roles of a glass cover plate and touch sensors. As compared with the G/G touch control technology, the OGS approach is advantageous in that a sheet of glass substrate and a corresponding fitting process are saved, and that production costs are thus reduced.

In a conventional OGS touch screen, metal bridging structures are used to achieve respective connectivity of diving lines (Tx) and sensing lines (Rx). The metal bridging structures are complicated to manufacture, and need to be provided thereon with an additional layer of overcoat because the metal is apt to oxidization. In addition, because a lead wire made of a metallic material (e.g., Mo—Al—Mo) is opaque, this opacity causes loss of visual effects. Furthermore, if the metallic lead wire is concealed in the bezel of the screen, it will occupy bezel area, making it difficult to achieve a narrow bezel design.

Therefore, there is a need for an improved OGS capacitive touch screen and its manufacturing method.

SUMMARY

Embodiments of the present disclosure provide an OGS capacitive touch screen and its manufacturing method, in which no metallic bridging structure is used such that drawbacks of the structure may be avoided.

According to a first aspect of the present disclosure, a method of manufacturing an OGS capacitive touch screen is provided which comprises: forming a first transparent electrically-conductive layer on a glass substrate; patterning the first transparent electrically-conductive layer to form a plurality of first touch electrodes arranged in a first direction; forming an overcoat layer on the patterned first transparent electrically-conductive layer; forming a plurality of vias in the overcoat layer, the vias corresponding to lead wire positions reserved for the plurality of first touch electrodes; forming a second transparent electrically-conductive layer on the overcoat layer having the vias; and patterning the second transparent electrically-conductive layer to form a plurality of second touch electrodes arranged in a second direction.

In some embodiments, patterning the second transparent electrically-conductive layer further comprises forming a plurality of lead wires for the first touch electrodes and a plurality of lead wires for the second touch electrodes. The lead wires for the first touch electrodes are connected to respective first touch electrodes through the vias, and the lead wires for the second touch electrodes are directly connected with respective second touch electrodes.

In some embodiments, the lead wires and the plurality of second touch electrodes are formed by using a one-time patterning process.

In some embodiments, the process comprises photolithography or laser etching.

In some embodiments, the lead wires are arranged in a visual area of the touch screen.

In some embodiments, the plurality of lead wires for the first touch electrodes and the plurality of lead wires for the second touch electrodes are led out to a top side or bottom side of the visual area of the touch screen, so that the touch screen is allowed to have no left and right lateral bezels.

In some embodiments, the first direction is perpendicular to the second direction.

In some embodiments, the plurality of first touch electrodes are driving electrodes, and the plurality of second touch electrodes are sensing electrodes. Alternatively, the plurality of first touch electrodes are sensing electrodes and the plurality of second touch electrodes are driving electrodes.

In some embodiments, the overcoat layer is formed by exposure and development.

In some embodiments, the overcoat layer is made of a transparent resin material.

In some embodiments, the first and the second transparent electrically-conductive layers are made of an Indium Tin Oxide material.

In some embodiments, the method further comprises: forming on the glass substrate a patterned black matrix located in a non-visual area of the screen prior to forming the first transparent electrically-conductive layer.

According to a second aspect of the present disclosure, an OGS capacitive touch screen is provided which comprises: a glass substrate; a first transparent electrically-conductive layer formed on the glass substrate and comprising a plurality of first touch electrodes arranged in a first direction; an overcoat layer formed on the first transparent electrically-conductive layer; a plurality of vias formed in the overcoat layer, the vias corresponding to lead wire positions reserved for the plurality of first touch electrodes; and a second transparent electrically-conductive layer formed on the overcoat layer and comprising a plurality of second touch electrodes arranged in a second direction.

These and other aspects of the present disclosure will be made apparent from and elucidated with reference to the embodiments described hereinafter.

DETAILED DESCRIPTION

Embodiments of the present disclosure will be described in detail with reference to the figures.

Figure 1:
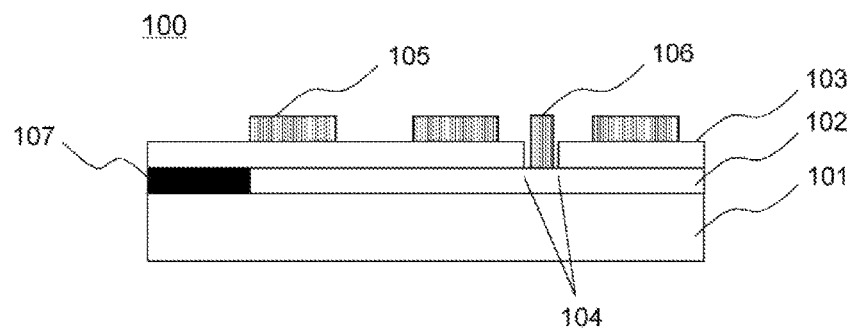
FIG. 1 schematically illustrates a structural side view of a cross section of an OGS capacitive touch screen according to an embodiment of the present disclosure.

FIG. 1 illustrates a structural side view of a cross section of an OGS capacitive touch screen 100 according to an embodiment of the present disclosure. As is illustrated, the touch screen 100 may comprise a glass substrate 101, a first transparent electrically-conductive layer comprising a plurality of first touch electrodes 102 arranged in a first direction, an overcoat layer 103, a plurality of vias 104 formed in the overcoat layer, and a second transparent electrically-conductive layer comprising a plurality of second touch electrodes 105 arranged in a second direction. In an example, the first and second transparent electrically-conductive layers may be made of an Indium Tin Oxide (ITO) material or other proper materials.

In the OGS structure, the glass substrate 101 functions as a substrate for forming touch sensors, and also functions as a cover plate of the display screen. A patterned black matrix 107 may be formed on the cover plate. It should be appreciated that the glass substrate 101 is only exemplary, and that other materials are also possible. In addition, in the touch screen, the black matrix is located in a non-visual area of the screen and mainly functions to prevent light leakage.

The first transparent electrically-conductive layer is formed on the glass substrate 101. Specifically, the first transparent electrically-conductive layer may comprise a plurality of first touch electrodes 102 arranged in the first direction. In the cross section as shown in FIG. 1, the first touch electrodes 102 are illustrated as being in a bar shape. However, they may be of other shapes as discussed later.

The overcoat layer 103 is formed on the first transparent electrically-conductive layer and functions to isolate the first touch electrodes 102 of the first transparent electrically-conductive layer from the second touch electrodes 105 of the second transparent electrically-conductive layer. As such, no complicated bridging structure is needed to separate the first touch electrodes 102 from the second touch electrodes 105. To improve the light transmittance of the touch screen, the overcoat layer 103 is usually made of a transparent material. In an example, the overcoat layer 103 is made of a transparent resin material.

The plurality of vias 104 are formed in the overcoat layer 103. The vias 104 correspond to lead wire positions reserved for the plurality of first touch electrodes 102. Since the first touch electrodes 102 of the first transparent electrically-conductive layer are covered by the overcoat layer 103, an electrical connection path for the first touch electrodes 102 is needed. An option is to form lead wires in the first transparent electrically-conductive layer along a direction in which the first touch electrodes 102 extend. However, for the first touch electrodes 102 of the first transparent electrically-conductive layer and the second touch electrodes 105 of the second transparent electrically-conductive layer, if lead wires are formed along their respective extending directions, respectively, wirings are needed in the two lateral bezels of the resultant touch screen because the extending direction of the first touch electrodes 102 is usually perpendicular to that of the second touch electrodes 105. This is unfavorable for the circuit wiring and the narrow bezel design. In the present embodiment, by forming vias 104 between the first and the second transparent electrically-conductive layers of the OGS touch screen, a need for complicated wiring is eliminated so that the OGS touch screen may be provided with design flexibility (e.g., a narrower bezel).

The second transparent electrically-conductive layer is formed on the overcoat layer 103. Specifically, the second transparent electrically-conductive layer may comprise the plurality of second touch electrodes 105 arranged in the second direction. As stated above, the extending direction (namely, the second direction) of the second touch electrodes 105 may be perpendicular to the extending direction (namely, the first direction) of the first touch electrodes 102, although this may not be the case in other embodiments. For example, the first direction may intersect the second direction at an angle other than 90°.

In an example, the first touch electrodes 102 may be driving electrodes (Tx), and the second touch electrodes 105 may be sensing electrodes (Rx). In another example, the first touch electrodes 102 may be sensing electrodes (Rx), and the second touch electrodes 105 may be driving electrodes (Tx). In the former example, the second touch electrodes 105, which are sensing electrodes (Rx), are closer to a touch object (e.g., a user's finger) that operates the touch screen. This is favorable in respect of improving the sensitivity.

The touch screen 100 further comprises a plurality of lead wires 106 formed on the overcoat layer 103. The lead wires 106 and the plurality of second touch electrodes 105 may be formed in the second transparent electrically-conductive layer by using a one-time patterning process. In other words, the lead wires 106 and the second touch electrodes 105 are located on the same layer and made of the same material. Only one lead wire 106 is shown in FIG. 1, which is connected to the first touch electrode 102 through the via 104. However, the touch screen 100 further comprises lead wires 106 for the second touch electrodes 105, which lead wires 106 may be directly connected with respective second touch electrodes 105.

Figure 2:
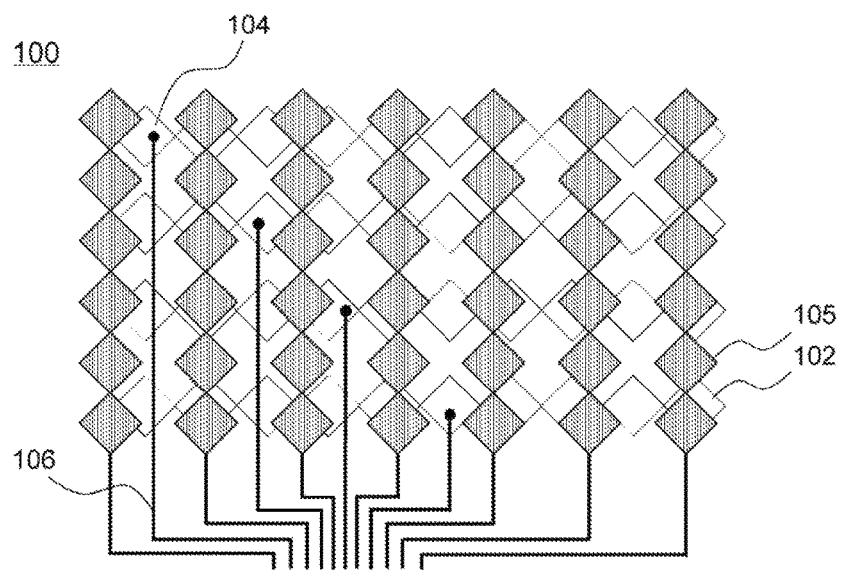
FIG. 2 schematically illustrates a structural top view of an OGS capacitive touch screen according to an embodiment of the present disclosure.

FIG. 2 schematically illustrates a structural top view of an OGS capacitive touch screen 100 according to an embodiment of the present disclosure. The concept and advantages of the present disclosure may be made more apparent from this figure. As shown in FIG. 2, each of the first touch electrodes 102 and the second touch electrodes 105 may comprise a plurality of electrode units connected in series. As is known, each of these electrode units may be in a diamond shape.

The first transparent electrically-conductive layer and the second transparent electrically-conductive layer are isolated from each other by the overcoat layer 103 (not shown), without need to use a bridging structure, thereby resulting in a simplified process. The first touch electrodes 102 and the second touch electrodes 105 may form capacitors at their intersections. For example, a diamond-shaped electrode unit of the first touch electrodes 102 and a diamond-shaped electrode unit of the second touch electrodes 105 may form a capacitor.

In some embodiments, the plurality of vias 104 are formed in the overcoat layer 103 so that the lead wires 106 for the first touch electrodes 102 and the lead wires 106 for the second touch electrodes 105 may be led out from the same side of the touch screen 100, as shown in FIG. 2. In addition, in place of metallic lead wires (Mo—Al—Mo) in the prior art, the lead wires 106 are made of a transparent electrically-conductive material (e.g., ITO). This provides improved light transmittance and visual effects as well as a possible narrow bezel design (because it is unnecessary to reserve a bezel for receiving visible metallic lead wires). In an example, the wirings may be arranged in a visual area ("VA"), namely, a visual area of the screen, rather than in the bezel, thereby achieving a bezel-less design. More specifically, the lead wires for the first touch electrodes 102 and the lead wires for the second touch electrodes 105 may be led out to a top side or bottom side of the visual area of the touch screen 100, so that the touch screen 100 is allowed to have no left and right lateral bezels.

Figure 3:
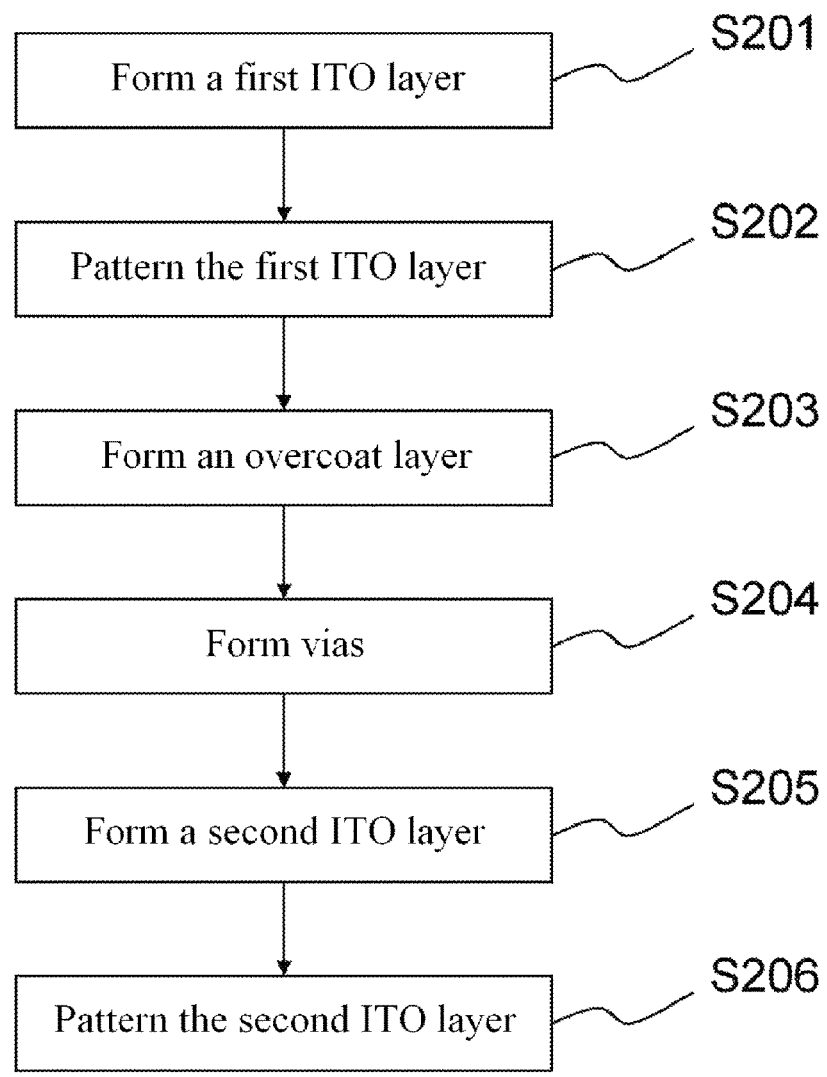
FIG. 3 is a flow chart of a method of manufacturing an OGS capacitive touch screen according to an embodiment of the present disclosure.

FIG. 3 is a flow chart of a method 200 of manufacturing an OGS capacitive touch screen according to an embodiment of the present disclosure. The method 200 may comprise the following steps.

At step S201, a first transparent electrically-conductive layer is formed on a glass substrate. The first transparent electrically-conductive layer may be formed by using for example a vacuum spluttering process, which is known in the art and will not be described in detail.

At step S202, the first transparent electrically-conductive layer is patterned to form a plurality of first touch electrodes arranged in a first direction. By way of example, and not limitation, a photolithography or laser etching process may be used to form the first touch electrodes.

At step S203, an overcoat layer is formed on the patterned first transparent electrically-conductive layer. As stated above, the overcoat layer is made of a transparent resin material and may be formed by exposure and development.

At step S204, a plurality of vias is formed in the overcoat layer, which vias correspond to lead wire positions reserved for the plurality of first touch electrodes.

At step S205, a second transparent electrically-conductive layer is formed on the overcoat layer having the vias. Likewise, the second transparent electrically-conductive layer may be formed by using for example the vacuum spluttering process.

At step S206, the second transparent electrically-conductive layer is patterned to form a plurality of second touch electrodes arranged in a second direction. In an example, the second touch electrodes may be formed by using the photolithography or laser etching process.

In the method 200, patterning the second transparent electrically-conductive layer may further comprise forming a plurality of lead wires respectively for the first touch electrodes and for the second touch electrodes. The lead wires for the first touch electrodes are connected to respective first touch electrodes through the vias, and the lead wires for the second touch electrodes are directly connected with respective second touch electrodes. In some embodiments, the lead wires for the first and the second touch electrodes and the plurality of second touch electrodes may be formed by using a one-time patterning process. As stated above, the process may comprise photolithography or laser etching. As is known, photolithography refers to a process of transferring desired patterns onto a substrate by using an optical-chemical reaction principle and a chemical/physical etching method, and laser etching refers to a process using laser to directly etch a thin film on a substrate to form desired patterns. As such, the lead wires may be formed while the second touch electrodes are formed in the second transparent electrically-conductive layer, without increasing any additional process. Moreover, as compared with the prior art using metallic lead wires (e.g., Mo—Al—Mo), the method 200 does not require an additional covering layer be formed for protecting metallic lead wires from oxidization.

In addition, the method 200 may further comprise forming on the glass substrate a patterned black matrix located in a non-visual area of the screen prior to forming the first transparent electrically-conductive layer. As stated above, the black matrix mainly functions to prevent light leakage.

Various modifications, adaptations to the foregoing exemplary embodiments of this disclosure may become apparent to those skilled in the relevant arts in view of the foregoing description, when read in conjunction with the accompanying drawings. Any and all modifications will still fall within the scope of the non-limiting and exemplary embodiments of this disclosure. Furthermore, other embodiments of the disclosures set forth herein will come to mind to one skilled in the art to which these embodiments of the disclosure pertain having the benefit of the teachings presented in the foregoing descriptions and the associated drawings.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A method of manufacturing an OGS capacitive touch screen, comprising:
   forming a first transparent electrically-conductive layer on a glass substrate;
   patterning the first transparent electrically-conductive layer to form a plurality of first touch electrodes arranged in a first direction;
   forming an overcoat layer on the patterned first transparent electrically-conductive layer;
   forming a plurality of vias in the overcoat layer, the vias corresponding to lead wire positions reserved for the plurality of first touch electrodes;
   forming a second transparent electrically-conductive layer on the overcoat layer having the vias; and
   patterning the second transparent electrically-conductive layer to form a plurality of second touch electrodes arranged in a second direction.

2. The method of claim 1, wherein patterning the second transparent electrically-conductive layer further comprises: forming a plurality of lead wires for the first touch electrodes and a plurality of lead wires for the second touch electrodes, wherein the lead wires for the first touch electrodes are connected to respective first touch electrodes through the vias, and the lead wires for the second touch electrodes are located on the same layer as the second touch electrodes and directly connected with respective second touch electrodes.

3. The method of claim 2, wherein the lead wires and the plurality of second touch electrodes are formed by using a one-time patterning process.

4. The method of claim 3, wherein the patterning process comprises photolithography or laser etching.

5. The method of claim 1, wherein the first direction is perpendicular to the second direction.

6. The method of claim 1, wherein the overcoat layer is formed by exposure and development.

7. The method of claim 1, wherein the overcoat layer is made of a transparent resin material.

8. The method of claim 1, wherein the first transparent electrically-conductive layer and the second transparent electrically-conductive layer are made of an Indium Tin Oxide material.

9. The method of claim 1, further comprising: forming on the glass substrate a patterned black matrix located in a non-visual area of the screen prior to forming the first transparent electrically-conductive layer.

10. An OGS capacitive touch screen, comprising:
    a glass substrate;
    a first transparent electrically-conductive layer formed on the glass substrate and comprising a plurality of first touch electrodes arranged in a first direction;
    an overcoat layer formed on the first transparent electrically-conductive layer;
    a plurality of vias formed in the overcoat layer, the vias corresponding to lead wire positions reserved for the plurality of first touch electrodes;

a second transparent electrically-conductive layer formed on the overcoat layer and comprising a plurality of second touch electrodes arranged in a second direction;

a plurality of first lead wires formed on the overcoat layer, the plurality of first lead wires being connected to respective ones of the plurality of first touch electrodes through the vias; and a plurality of second lead wires formed on the overcoat layer, the plurality of second lead wires being directly connected to respective ones of the plurality of second touch electrodes.

11. The touch screen of claim 10, wherein the first and second lead wires and the plurality of second touch electrodes are located on the same layer and made of the same material.

12. The touch screen of claim 10, wherein the first and second lead wires are arranged in a visual area of the touch screen.

13. The touch screen of claim 12, wherein the first and second lead wires are led out to a top side or bottom side of the visual area of the touch screen.

14. The touch screen of claim 10, wherein the first direction is perpendicular to the second direction.

15. The touch screen of claim 10, wherein the plurality of first touch electrodes are driving electrodes, and the plurality of second touch electrodes are sensing electrodes.

16. The touch screen of claim 10, wherein the overcoat layer is made of a transparent resin material.

17. The touch screen of claim 10, wherein the first transparent electrically-conductive layer and second transparent electrically-conductive layer are made of an Indium Tin Oxide material.

18. The touch screen of claim 10, further comprising a patterned black matrix formed on the glass substrate and located in a non-visual area of the screen.

19. The touch screen of claim 10, wherein the plurality of first touch electrodes are sensing electrodes and the plurality of second touch electrodes are driving electrodes.

* * * * *